(12) United States Patent
Su et al.

(10) Patent No.: US 10,680,100 B2
(45) Date of Patent: Jun. 9, 2020

(54) FIELD STRUCTURE AND METHODOLOGY

(71) Applicant: Taiwan Semiconductor Manufacturing Co., Ltd., Hsin-Chu (TW)

(72) Inventors: Po-Chih Su, New Taipei (TW);
Hsueh-Liang Chou, Jhubei (TW);
Ruey-Hsin Liu, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/026,290

(22) Filed: Jul. 3, 2018

(65) Prior Publication Data

US 2020/0013888 A1 Jan. 9, 2020

(51) Int. Cl.
*H01L 29/78* (2006.01)
*H01L 21/765* (2006.01)
*H01L 29/66* (2006.01)
*H01L 29/40* (2006.01)

(52) U.S. Cl.
CPC ........ *H01L 29/7816* (2013.01); *H01L 21/765* (2013.01); *H01L 29/402* (2013.01); *H01L 29/66681* (2013.01)

(58) Field of Classification Search
CPC . H01L 29/7816; H01L 29/402; H01L 21/765; H01L 29/66681
See application file for complete search history.

(56) References Cited

U.S. PATENT DOCUMENTS

| | | | | |
|---|---|---|---|---|
| 9,590,053 | B2 * | 3/2017 | Chou | H01L 29/402 |
| 9,871,132 | B1 * | 1/2018 | Liu | H01L 29/7816 |
| 2009/0140343 | A1 * | 6/2009 | Feilchenfeld | H01L 29/407 257/367 |
| 2012/0319182 | A1 * | 12/2012 | Satoh | H01L 29/78 257/288 |
| 2013/0134512 | A1 * | 5/2013 | Cheng | H01L 29/402 257/339 |
| 2013/0277741 | A1 * | 10/2013 | Guowei | H01L 29/402 257/343 |
| 2015/0380487 | A1 * | 12/2015 | Yoshida | H01L 29/7835 257/390 |
| 2017/0062608 | A1 * | 3/2017 | Mori | H01L 29/1083 |
| 2017/0352731 | A1 * | 12/2017 | Kuo | H01L 29/401 |
| 2018/0151410 | A1 * | 5/2018 | Usami | H01L 21/308 |
| 2019/0088777 | A1 * | 3/2019 | Lu | H01L 23/49575 |

* cited by examiner

*Primary Examiner* — Victor A Mandala
(74) *Attorney, Agent, or Firm* — Eschweiler & Potashnik, LLC (57) ABSTRACT

The present disclosure relates to a high voltage transistor device having a field structure that includes at least one conduction unit, and a method of formation. In some embodiments, the high voltage transistor device has a gate electrode disposed over a substrate between a source region and a drain region located within the substrate. A dielectric layer laterally extends from over the gate electrode to over a drift region between the gate electrode and the drain region. A field structure is located within the first ILD layer. The field structure includes a conduction unit having a vertically elongated shape and vertically extending from a top surface of the dielectric layer and a top surface of the first ILD layer.

20 Claims, 8 Drawing Sheets

FIELD STRUCTURE AND METHODOLOGY

BACKGROUND

Modern day integrated chips comprise millions or billions of semiconductor devices formed on a semiconductor substrate (e.g., silicon). Integrated chips (ICs) may use many different types of transistor devices, depending on an application of an IC. In recent years, the increasing market for cellular and RF (radio frequency) devices has resulted in a significant increase in the use of high voltage transistor devices. For example, high voltage transistor devices are often used in power amplifiers in RF transmission/receiving chains due to their ability to handle high breakdown voltages (e.g., greater than about 50V) and high frequencies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

High voltage transistor devices are often constructed to have field plates. Field plates are conductive elements, which are placed over a channel region to enhance the performance of a high voltage transistor device by manipulating electric fields (e.g., reducing peak electric fields) generated by a gate electrode. By manipulating the electric field generated by the gate electrode, the high voltage transistor device can achieve higher breakdown voltages. For example, LDMOS (laterally diffused metal oxide semiconductor) transistor devices often comprise field plates that extend from a channel region to an adjacent drift region disposed between the channel region and a drain region.

Field plates can be formed in a number of different ways. For example, field plates may be formed by extending a conductive gate material (e.g., polysilicon) from a gate electrode towards a drift region. However, in such configurations the field plate is synchronized to a gate bias, which burdens the gate-to-drain capacitance ($C_{gd}$) and worsens the switching losses of the device. Alternatively, the conductive gate material can be patterned to form a separate field plate. Such configurations reduce the gate-to-drain capacitance ($C_{gd}$), but placement of the field plates are often restricted by design rules. In yet another alternative, non-gate materials can be used for field plate formation. However, such solutions use additional processing steps that increase the fabrication cost of a resulting integrated chip. Another approach is to use a dedicated conduction layer as a field plate instead of utilizing gate material. While this approach provides a tunable field plate with optimal electrical characteristics, additional fabrication steps are needed to form the conduction layer, which complicates the fabrication process and raises cost concerns.

The present disclosure relates to a high voltage transistor device having a field structure that includes at least one conduction unit made from conductive material. The conduction unit(s) has a similar geometry to metal contacts or vias associated with the transistor source and/or drain. The conduction unit(s) may be formed concurrently with formation of contacts or vias to enable a low-cost method of fabrication.

In some embodiments, the high voltage transistor device has a gate electrode disposed over a substrate between a source region and a drain region located within the substrate. A dielectric layer laterally extends from over the gate electrode to a drift region arranged between the gate electrode and the drain region. A field structure that includes at least one conduction unit is located within a first inter-level dielectric (ILD) layer overlying the substrate. The at least one conduction unit is disposed over the drift region and vertically extends from the dielectric layer to a top surface of the first ILD layer. A plurality of metal contacts, which may have a same conductive material as the at least one conduction unit, vertically extend from a bottom surface of the first ILD layer to a top surface of the first ILD layer.

Figure 1:
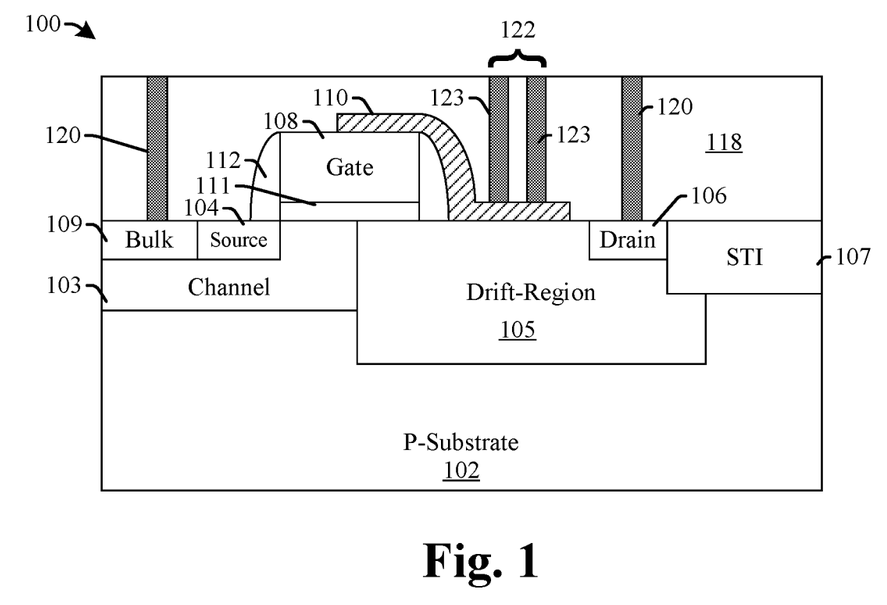
FIG. 1 illustrates a cross-sectional view of some embodiments of a disclosed high voltage transistor device having a field structure that includes conduction units.
Figure 12:
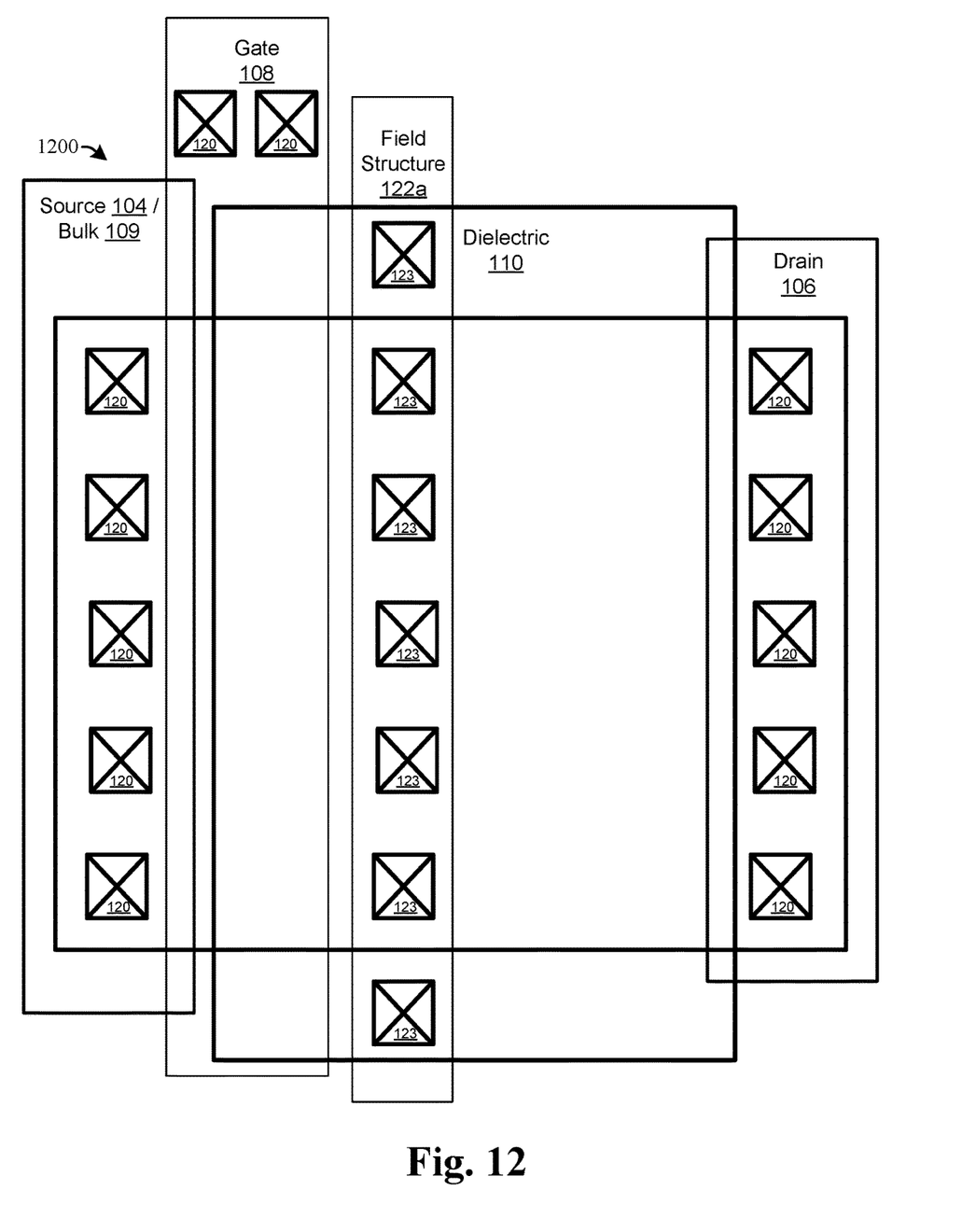
FIG. 12 illustrates a top plan view of some embodiments of a high voltage transistor device having a field structure that includes a single column of conduction units.
Figure 13:
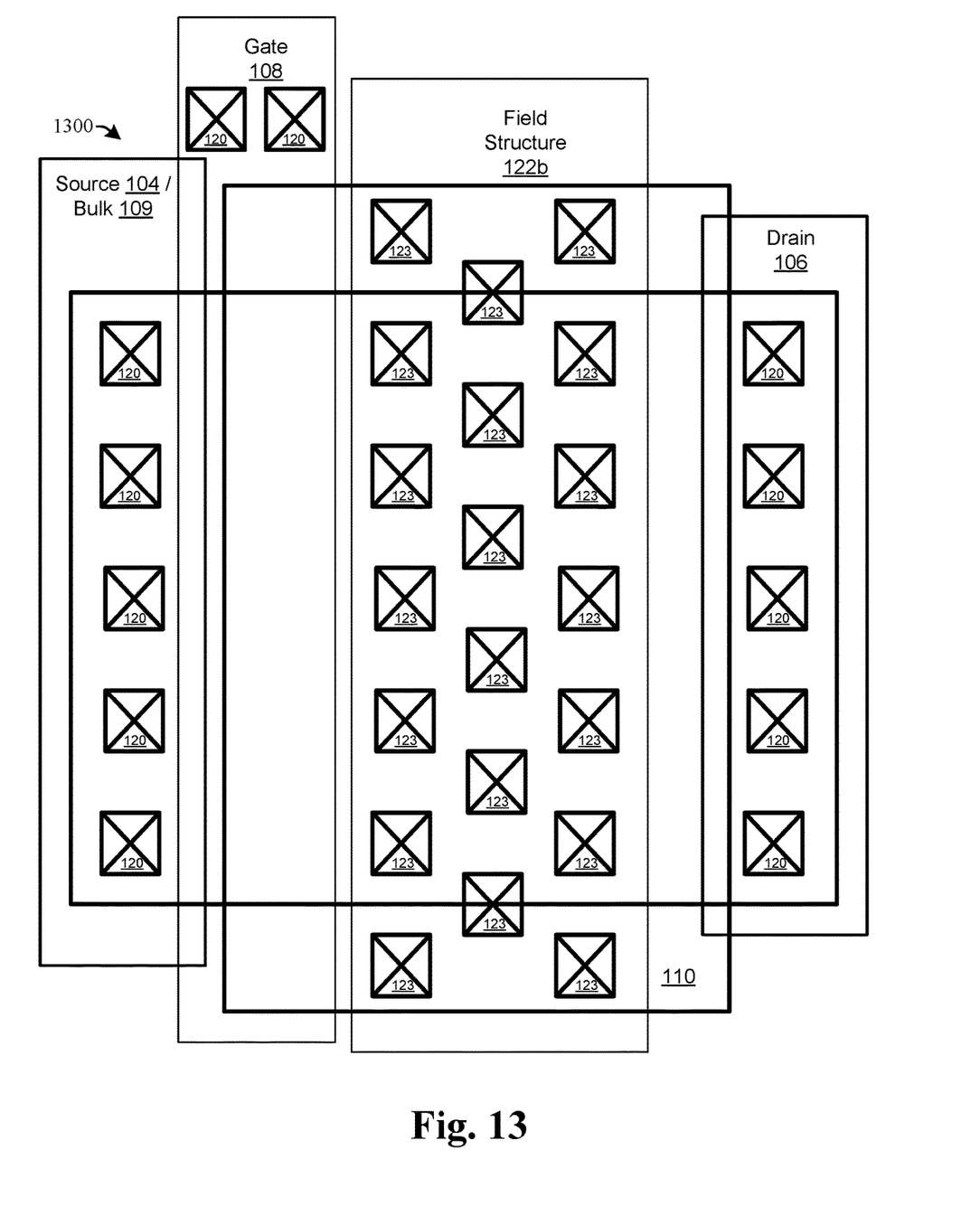
FIG. 13 illustrates a top plan view of some embodiments of a high voltage transistor device having a field structure that includes two columns of conduction units arranged in staggered formation.

FIG. 1 illustrates a cross-sectional view of some embodiments of a disclosed high voltage transistor device 100 having a field structure 122 that includes two columns of conduction units 123 (see FIGS. 12 and 13 for a top view of example column arrangements).

The high voltage transistor device 100 comprises a source region 104 and a drain region 106 disposed within a semiconductor substrate 102. The semiconductor substrate 102 has a first doping type, while the source region 104 and the drain region 106 have a second doping type, with a higher doping concentration than the semiconductor substrate 102. As illustrated, in some embodiments, the first doping type may be a p-type doping and the second doping type may be an n-type doping. In some embodiments, the source region 104 and the drain region 106 may have doping concentrations that are in a range of between approximately $10^{19}$ cm$^{-3}$ and approximately $10^{20}$ cm$^{-3}$ In other embodiments, the first doping type may be an n-type doping and the second doping type may be a p-type doping.

The drain region 106 is disposed within a drift region 105 that is arranged within the semiconductor substrate 102. The drift region 105 comprises a second doping type having a relatively low doping concentration, which provides for a higher resistance when the high voltage transistor device 100 is operated at a high voltage. In some embodiments, the drift region 105 may have a doping concentration that is in a range of between approximately $10^{15}$ cm$^{-3}$ and approximately $10^{17}$ cm$^{-3}$. A shallow trench isolation region 107 is disposed in the substrate 102 to isolate the drain region 106 from a bulk region of an adjacent device (not shown).

A gate structure is disposed over the semiconductor substrate 102 at a position that is laterally arranged between the source region 104 and the drain region 106. The gate structure comprises gate electrode 108 that is separated from the semiconductor substrate 102 by a gate dielectric layer 111. In some embodiments, the gate dielectric layer 111 may comprise silicon dioxide ($SiO_2$) or a high-k gate dielectric material and the gate electrode 108 may comprise polysilicon or a metal gate material (e.g., aluminum). In some embodiments, the gate structure may also comprise sidewall spacers 112 disposed on opposing sides of the gate electrode 108. In various embodiments, the sidewall spacers 112 may comprise a nitride based sidewall spacer (e.g., comprising SiN) or an oxide-based sidewall spacer (e.g., $SiO_2$, SiOC, etc.).

A dielectric layer (or layers) 110 is disposed over the gate electrode 108 and the drift region 105 to separate a field structure 122 from the drift region 105 and the gate electrode 108. In some embodiments, the dielectric layer 110 may be conformally disposed onto the drift region 105, the gate electrode 108, and the sidewall spacers 112. In some embodiments, the dielectric layer 110 may comprise an ultra-low k dielectric material or a low-k dielectric material (e.g., SiCO). In other embodiments, the dielectric layer 110 may comprise an oxide (e.g., silicon oxide, silicon di-oxide, RPO (resist protective oxide) layer, and so on), a nitride (e.g., silicon nitride, silicon oxy-nitride, and so on), a carbide (e.g., silicon carbide, and so on), or the like.

Upon receiving a bias voltage, the gate electrode 108 is configured to generate an electric field that controls the movement of charge carriers within a channel region 103 laterally disposed between the source region 104 and the drain region 106. For example, during operation, a gate-source voltage ($V_{GS}$) can be selectively applied to the gate electrode 108 relative to the source region 104, forming a conductive channel in the channel region 103. While $V_{GS}$ is applied to form the conductive channel, a drain to source voltage ($V_{DS}$) is applied to move charge carriers between the source region 104 and the drain region 106.

The channel region 103 laterally extends from the source region 104 to an adjacent drift region 105 (i.e., a drain extension region). A portion of the gate structure is disposed over the channel region 103. In some embodiments, the gate structure may extend from over the channel region 103 to a position overlying a portion of the drift region 105.

A first inter-level dielectric (ILD) layer 118 is disposed over the semiconductor substrate 102. In some embodiments, the first ILD layer 118 may comprise a dielectric material having a relatively low dielectric constant (e.g., less than or equal to approximately 3.9), which provides for electrical isolation between a plurality of contacts 120 and/or a field structure 122. In some embodiments, the first ILD layer 118 may comprise an ultra-low k dielectric material or a low-k dielectric material (e.g., SiCO). In some embodiments, the first ILD layer 118 may comprise a different material than the dielectric layer 110.

In some embodiments, a plurality of contacts 120 are disposed in the first ILD layer 118. The plurality of contacts 120 are configured to provide for a vertical connection between a bulk region 109, the drain region 106, or the gate electrode 108 (a gate contact is not shown in the cross sections of FIGS. 1-10) and a first back-end-of-the-line (BEOL) metal wire layer (not shown, see FIG. 10) disposed within a second ILD layer (not shown, see FIG. 10) overlying the first ILD layer 118.

A field structure 122 that includes a plurality of conduction units 123 (i.e., two columns of several conduction units in each column are illustrated in FIGS. 1-10) is disposed within the first ILD layer 118 at a position overlying a portion of the drift region 105. The field structure 122 may be disposed over the dielectric layer 110. In some embodiments, the dielectric layer 110 laterally extends past the field structure 122 in one or more directions. Each conduction unit 123 has a vertically elongated shape and vertically extends from a top surface of the dielectric layer 110 to a top surface of the first ILD layer 118. For the purposes of this description, the term "vertically elongated shape" refers broadly to a shape having a length that is significantly greater than its width and depth. Examples of elements that have an elongated shape include a via or a rod. Elongated shapes include cylinders or rectangular boxlike shapes that have a length that is significantly greater than their width and depth.

The size of the field structure 122 and the number of conduction units 123 may vary depending on the size and characteristics of the high voltage transistor device 100. In some embodiments, the plurality of contacts 120 and the conduction units 123 may comprise a same metal material. For example, the plurality of contacts 120 and the conduction units 123 may comprise one or more of tungsten (W), tantalum-nitride (TaN), titanium (Ti), titanium-nitride (TiN), aluminum copper (AlCu), copper (Cu), and/or other similar conductive materials. The conduction units 123 may comprise the same conductive metal material as the plurality of contacts 120. In some embodiments, the conduction units 123 have a same vertically elongated shape as the plurality of contacts 120. This means that the conduction units can be formed using the same process steps and patterns as the contacts 120.

During operation, the field structure 122 is configured to act upon the electric field generated by the gate electrode 108. The field structure 122 may be configured to change distribution of the electric field generated by the gate electrode 108 in the drift region 105, which enhances the internal electric field of the drift region 105 and increases the drift doping concentration of the drift region 105, thereby enhancing the breakdown voltage capability of the high voltage transistor device 100.

Figure 2:
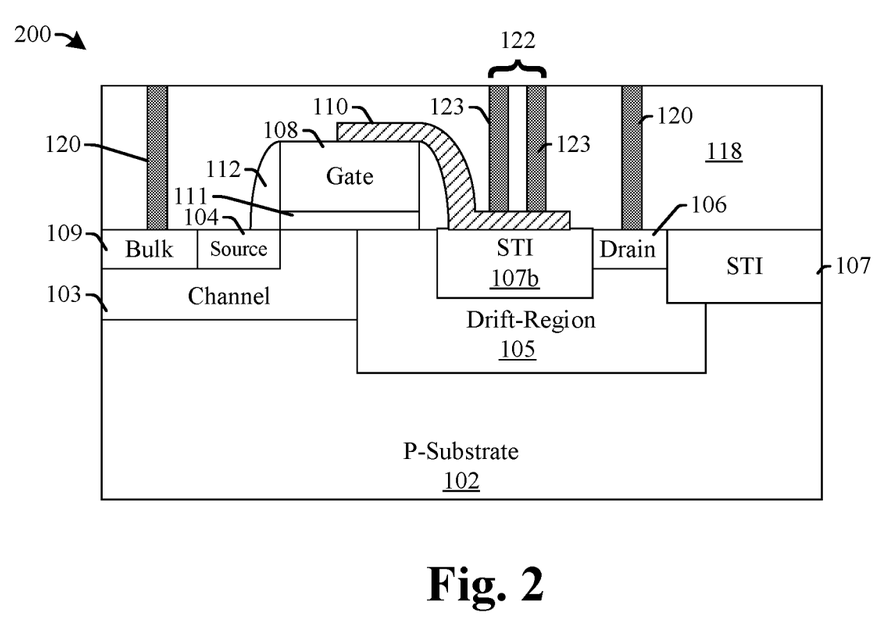
FIG. 2 illustrates a cross-sectional view of another embodiment of a disclosed high voltage transistor device having a field structure that includes at least one conduction unit.

FIG. 2 illustrates an example high voltage transistor device 200 that is similar to the high voltage transistor device 100 of FIG. 1 except that device 200 includes an additional STI region 107*b* disposed at an opposite side of the drain region 106 and below the dielectric layer 110. It will be appreciated that due to its integration with the BEOL (back-end-of-the-line) metallization layers, the disclosed field structure that includes at least one conduction unit illustrated in FIGS. 1 and 2 allows for various conduction unit bias configurations to be easily achieved for different design considerations. The field structure bias configuration can be synchronized with gate bias, source bias, or an arbitrary bias according to the best fit for electrical performance.

The use of discrete conduction units 123 to embody the field structure 122 provides several advantages. Since the conduction units 123 share a similar shape and material with the contacts 120, the conduction units 123 may be defined simultaneously with the contacts. The conduction units 123 may be placed on existing dielectrics, such as the gate oxide, silicide block layer (e.g., resist-protection oxide (RPO), ILD, IMD, and so on). The discrete conduction units 123 may be arranged in different patterns and in different quantities depending on the desired performance. The conduction units 123 may be selectively connected to either ground or a voltage to achieve the desired performance. Further, the use of a plurality of isolated conduction units 123 rather than a continuous field structure, such as a plate, reduces parasitic capacitance.

FIGS. 3-10 illustrate cross-sectional views of some embodiments showing a method of forming a MOSFET device having a field structure that includes at least one conduction unit.

Figure 3:
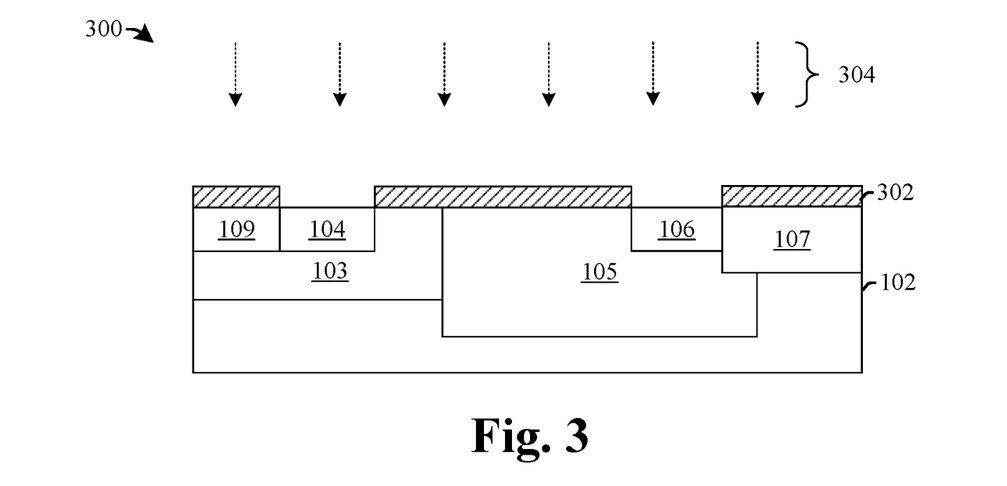
FIGS. 3-10 illustrate cross-sectional views of some embodiments showing a method of forming a high voltage transistor device having a field structure that includes at least one conduction unit.

FIG. 3 illustrates a cross-sectional view 300 of some embodiments of forming a MOSFET device having a field structure that includes at least one conduction unit.

As shown in cross-sectional view 300, a semiconductor substrate 102 is provided. The semiconductor substrate 102 may be intrinsically doped with a first doping type. In various embodiments, the semiconductor substrate 102 may comprise any type of semiconductor body (e.g., silicon, SOI), which includes, but is not limited to a semiconductor die or wafer or one or more die on a wafer, as well as any other type of semiconductor and/or epitaxial layers formed thereon and/or otherwise associated therewith.

The semiconductor substrate 102 may be selectively implanted using various implantation steps to form a plurality of implantation regions (e.g., well regions, contact regions, etc.). For example, the semiconductor substrate 102 may be selectively implanted to form a channel region 103, a drift region 105, a source region 104, a drain region 106, and a bulk region 109. The plurality of implantation regions may be formed by selectively masking the semiconductor substrate 102 (e.g., using a photoresist mask) and then introducing high-energy dopants 304 (e.g., p-type dopant species such as boron or n-type dopants such as phosphorous) into exposed areas of the semiconductor substrate 102. For example, as shown in cross-sectional view 300, a masking layer 302 is selectively patterned to expose portions of the semiconductor substrate 102, into which high-energy dopants 304 are subsequently implanted to form the source region 104 and the drain region 106.

It will be appreciated that the implantation regions shown in cross-sectional view 300 are one example of possible implantation regions and that the semiconductor substrate 102 may comprise other configurations of implantation regions.

Figure 4:
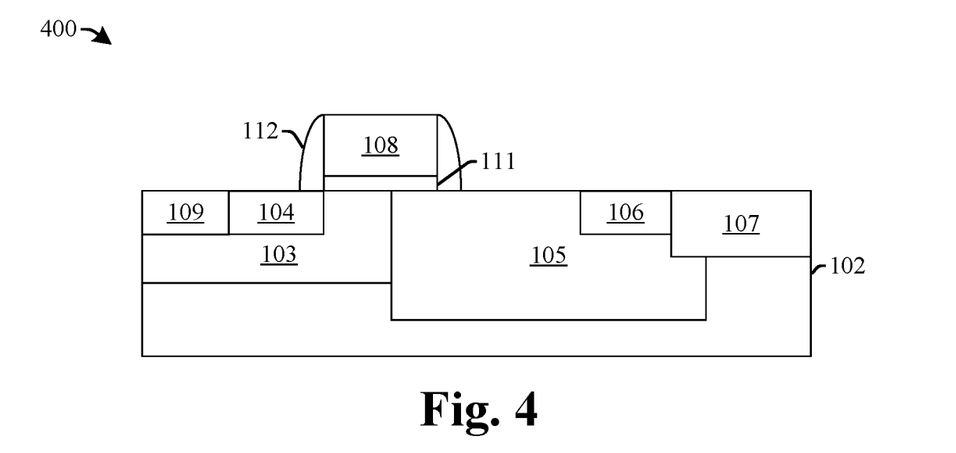

FIG. 4 illustrates a cross-sectional view 400 of some embodiments of forming a MOSFET device having a field structure that includes at least one conduction unit.

As shown in cross-sectional view 400, a gate structure is formed over a semiconductor substrate 102 at a position arranged between the source region 104 and the drain region 106. The gate structure may be formed by forming a gate dielectric layer 111 over the semiconductor substrate 102, and by forming a gate electrode material 108 over the gate dielectric layer 111. In some embodiments, the gate dielectric layer 111 and the gate electrode material 108 may be deposited by a vapor deposition technique. The gate dielectric layer 111 and the gate electrode material 108 may be subsequently patterned (e.g., etched according to a photoresist mask) to define the gate structure. In some embodiments, the sidewall spacers 112 may be formed on opposing sides of the gate electrode 108 by depositing a nitride or oxide based material onto the semiconductor substrate 102, and selectively etching the nitride or oxide based material to form the sidewall spacers 112.

Figure 5:
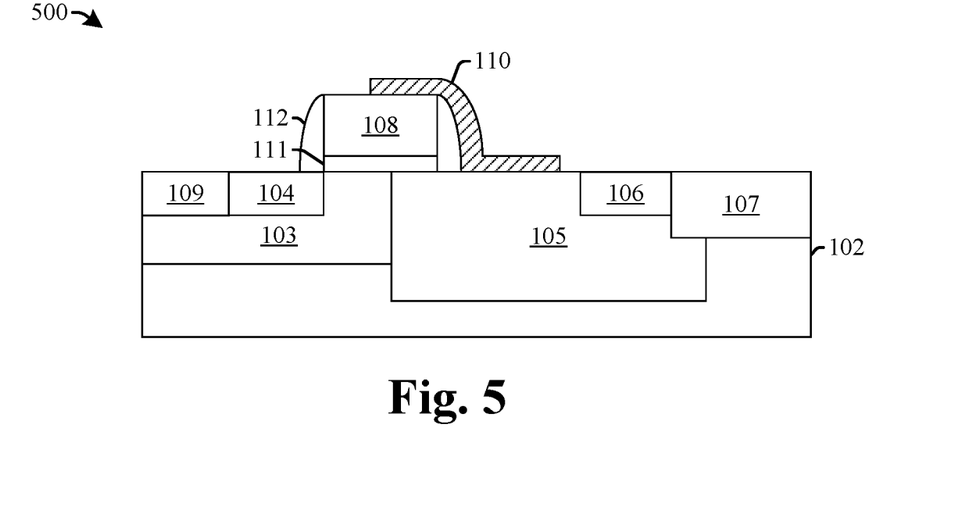

FIG. 5 illustrates a cross-sectional view 500 of some embodiments of forming a MOSFET device having a field structure that includes at least one conduction unit.

As shown in cross-sectional view 500, a dielectric layer 110 is selectively formed over the gate electrode 108 and the drift region 105. In some embodiments, the dielectric layer 110 may be deposited by a vapor deposition technique, and subsequently patterned (e.g., etched according to a photoresist mask). In some embodiments, the dielectric layer 110 may be etched to expose a portion of the gate electrode 108 and to be laterally spaced apart from the drain region 106.

In some embodiments, the dielectric layer 110 may comprise a silicide blocking layer, such as a resist-protection oxide (RPO) layer. In other embodiments, the dielectric layer 110 may further and/or alternatively comprise a field structure that includes at least one conduction unit etch stop layer (ESL). In some embodiments, the ESL may be a silicon nitride (SiN) layer formed by a vapor deposition technique. In yet other embodiments, the dielectric layer 110 may further and/or alternatively comprise a gate dielectric layer or an inter-level dielectric (ILD) layer.

Figure 6:
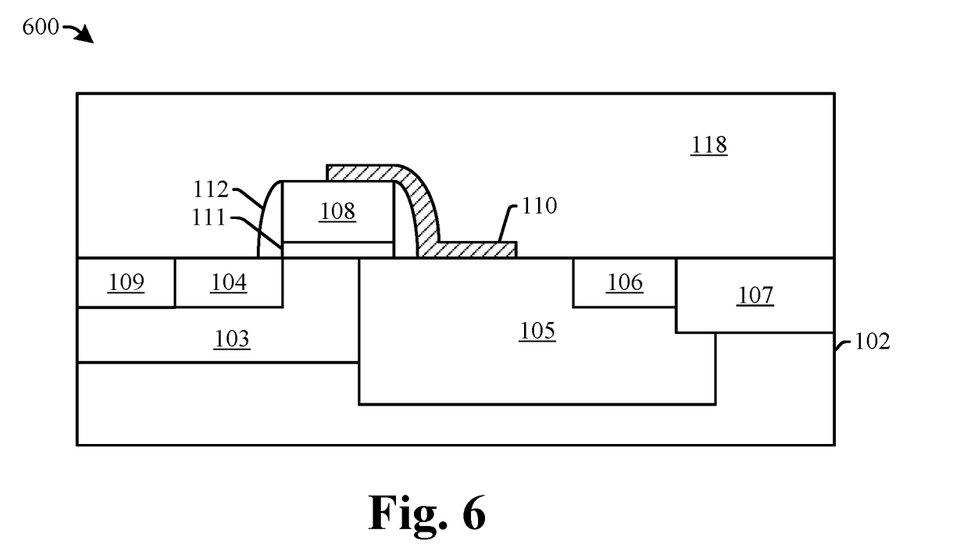

FIG. 6 illustrates a cross-sectional view 600 of some embodiments of forming a MOSFET device having a field structure that includes at least one conduction unit.

As shown in cross-sectional view 600, a first inter-level dielectric (ILD) layer 118 is formed over the semiconductor substrate 102. In some embodiments, the first ILD layer 118 may comprise an ultra-low k dielectric material or a low-k dielectric material (e.g., SiCO). In some embodiments, the first ILD layer 118 may also be formed by a vapor deposition process. In other embodiments, the first ILD layer 118 may be formed by a spin coating process. It will be appreciated that the term inter-level dielectric (ILD) layer as used herein may also refer to inter-metal dielectric (IMD) layers.

Figure 7:
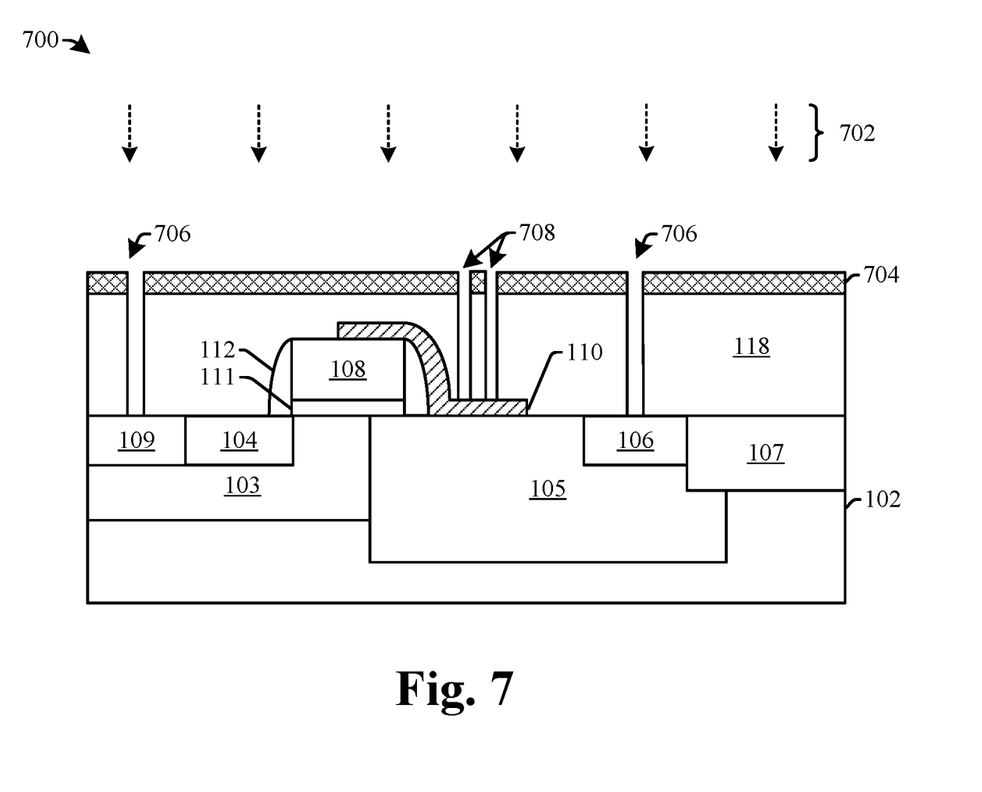

FIG. 7 illustrates a cross-sectional view 700 of some embodiments of forming a MOSFET device having a field structure that includes at least one conduction unit.

As shown in cross-sectional view 700, the first ILD layer 118 is selectively exposed to a first etchant 702 configured to form contacts openings 706 and conduction unit openings 708. In some embodiments, the contact openings 706 and the conductive unit openings may both have vertically elongated shapes. In some embodiments, the conduction unit openings 708 may be formed concurrently with formation of contact openings 706. In some embodiments, the first ILD layer 118 is selectively exposed to the first etchant 702 according to a masking layer 704 (e.g., a photoresist layer or a hard mask layer). In some embodiments, the first etchant 702 may have a large etching selectivity between the first ILD layer 118 and the dielectric layer 110. In some embodiments, the first etchant 702 may comprise a dry etchant. In some embodiments, the dry etchant may have an etching chemistry comprising one or more of oxygen (O2), nitrogen (N2), hydrogen (H2), argon (Ar), and/or a fluorine species (e.g., $CF_4$, $CHF_3$, $C_4F_8$, etc.). In other embodiments, the first etchant 702 may comprise a wet etchant comprising a buffered hydroflouric acid (BHF).

Figure 8:
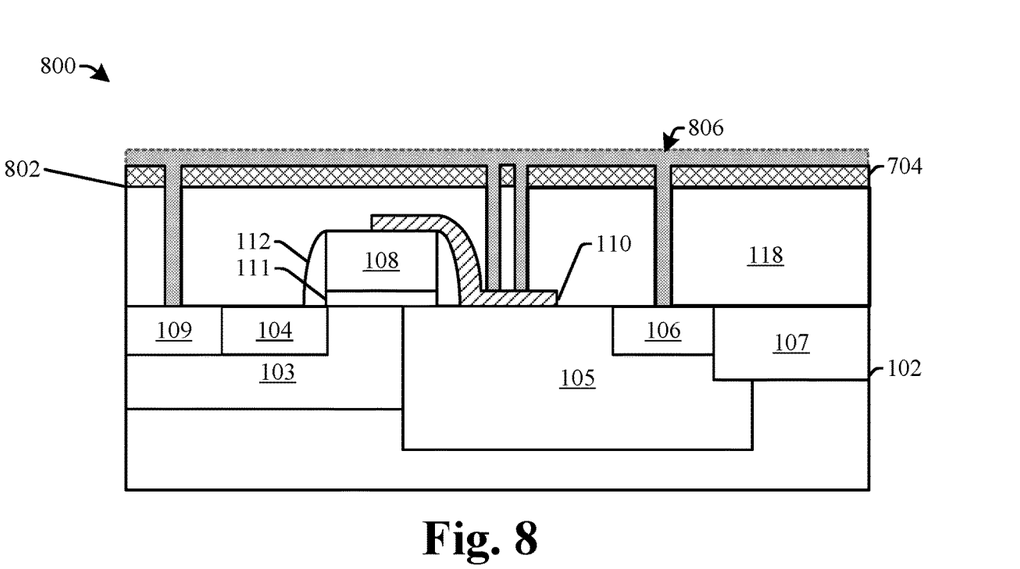

FIG. 8 illustrates a cross-sectional view 800 of some embodiments of forming a MOSFET device having a field structure that includes at least one conduction unit.

As shown in cross-sectional view 800, the contact openings 706 and the conduction unit openings 708 are filled with a first conductive material 806. In some embodiments, the conduction unit openings 708 and the contact openings 706 are filled concurrently. In some embodiments, the first conductive material 806 may be deposited by way of a vapor deposition technique (e.g., CVD, PVD, PE-CVD, etc.). In some embodiments, the first conductive material 806 may be formed by depositing a seed layer by way of physical vapor deposition, followed by a plating process (e.g., an electroplating or electro-less plating process). A planarization process (e.g., chemical mechanical planarization) may be subsequently performed to remove excess of the first conductive material 806 and to form a planar surface along line 802.

In some embodiments, the first conductive material 806 may comprise tungsten (W), titanium (Ti), titanium nitride (TiN), or tantalum nitride (TaN). In some embodiments, a diffusion barrier layer and/or a liner layer may be deposited into the contact openings 706 and the conduction unit openings 708 prior to depositing the first conductive material 806. In some embodiments, the contact openings 706 and the conduction unit openings 708 may be concurrently filled with the first conductive material. In other embodiments, not illustrated here, the first conductive material 806 is used to fill contact openings 706 and not conduction unit openings 708. A second conductive material, selected from tungsten (W), titanium (Ti), titanium nitride (TiN), or tantalum nitride (TaN) is deposited into the conduction unit openings 708 at a different time.

Figure 9:
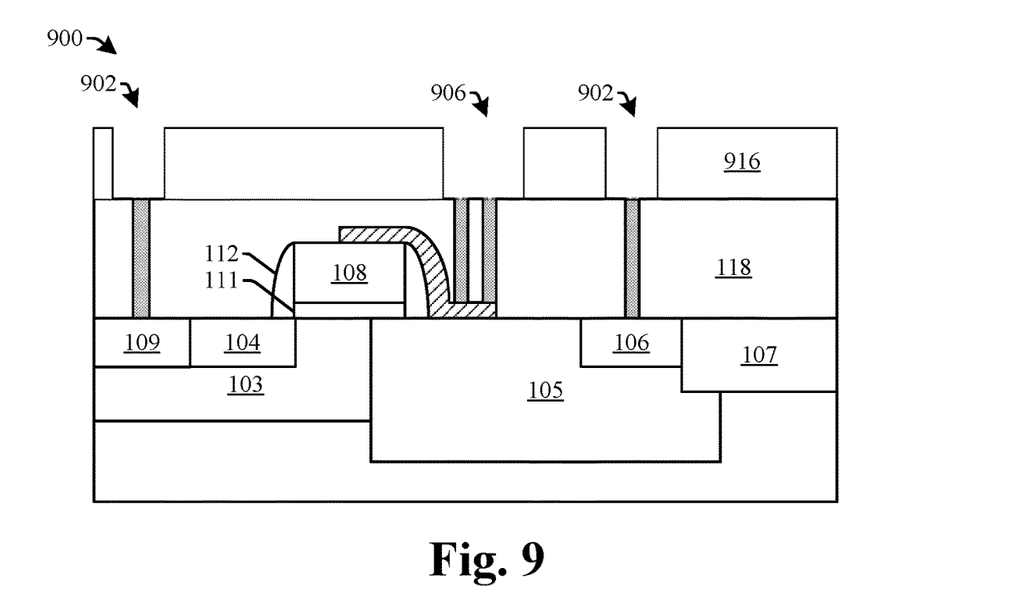
Figure 10:
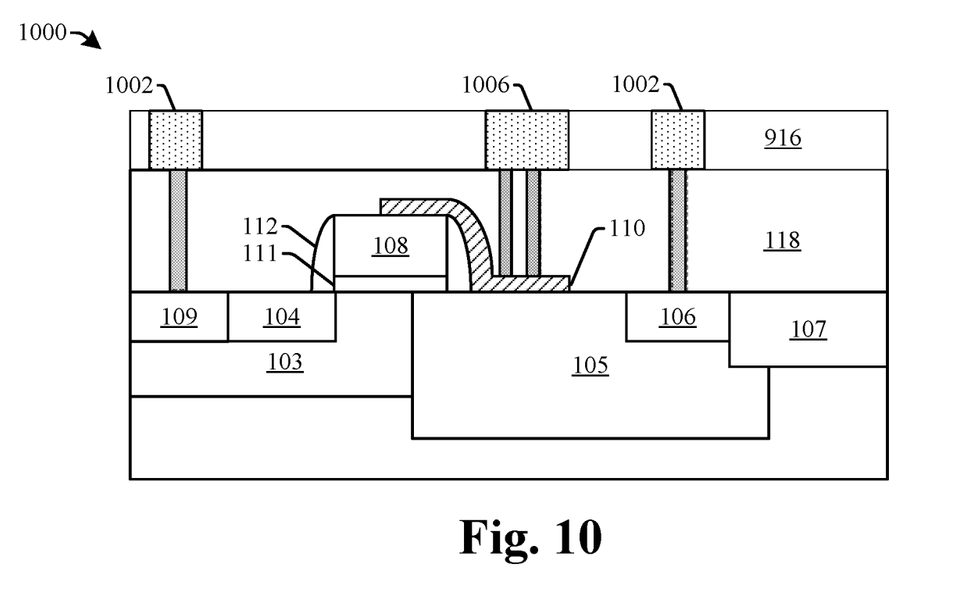

FIGS. 9 and 10 illustrate cross-sectional views 900 and 1000 of some embodiments of forming a MOSFET device having a field structure that includes at least one conduction unit.

As shown in cross-sectional view 900, a second ILD layer 916 is formed over the first ILD layer 118. In some embodiments, the second ILD layer 916 may comprise an ultra-low k dielectric material or a low-k dielectric material (e.g., SiCO). In some embodiments, the second ILD layer 916 may also be formed by a vapor deposition process. In other embodiments, the second ILD layer 916 may be formed by a spin coating process. The second ILD layer 916 is patterned to form trenches 902 and trenches 906.

As shown in cross-sectional view 1000, the trenches 902 and the trenches 906 are filled with a conductive material. In some embodiments, a second planarization process is performed after filling the trenches 902 and the trenches 906 with the conductive material, to remove the first conductive material over the second ILD layer 916 and to define structures 1002, 1006 of the first metal wire layer.

Figure 11:
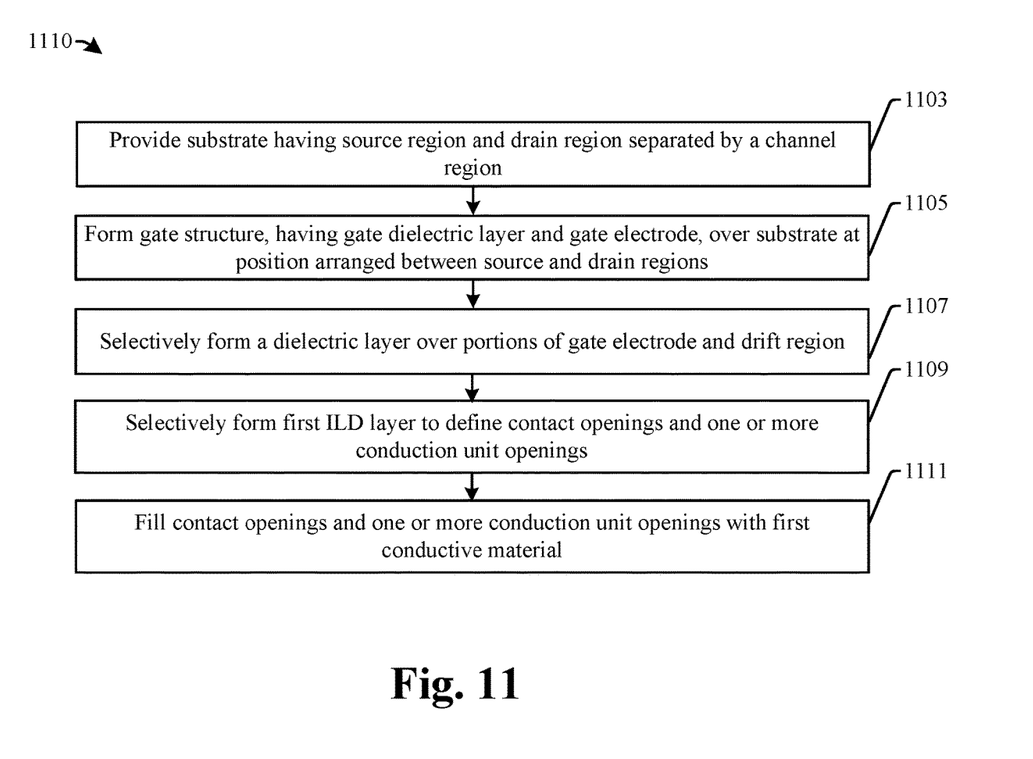
FIG. 11 illustrates a flow diagram of some embodiments of a method of forming a high voltage transistor device having a field structure that includes at least one conduction unit.

FIG. 11 illustrates a flow diagram of some embodiments of a method 1110 of forming a high voltage transistor device having a field structure that includes at least one conduction unit. The method 1110 may form the field structure that includes at least one conduction unit using process steps that are already used during a standard CMOS fabrication process, and therefore can provide for a low cost, versatile field structure. The method 1110 will be cross-referenced in this description to cross-section views of FIGS. 3-10. Although FIG. 11 is described in relation to the cross sections illustrated in FIGS. 3-10, it will be appreciated that the method 1110 is not limited to the structures illustrated in FIGS. 3-10, but instead may stand alone as a method independent of the structures.

While the disclosed method 1110 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1103, a substrate is provided having a source region and a drain region separated by a channel region. In some embodiments, the substrate may further comprise a drift region located between the source region and the drain region at a position adjacent to the channel region. In some embodiments, 1103 corresponds to the structures illustrated in the cross-section view of FIG. 3.

At 1105, a gate structure is formed over the substrate at a position arranged between the source region and the drain region. The gate structure may comprise a gate dielectric layer and an overlying gate electrode. In some embodiments, 1105 corresponds to the structures illustrated in the cross-section view of FIG. 4.

At 1107, one or more dielectric layers are selectively formed over a portion of the gate electrode and a drift region. In some embodiments, 1107 corresponds to the structures illustrated in the cross-section view of FIG. 5.

At 1109, a first ILD layer is selectively formed to define contact openings and one or more conduction unit openings. In some embodiments, 1109 corresponds to the structures illustrated in the cross-section view of FIGS. 6 and 7.

At 1111, the contact openings and the one or more conduction unit openings are filled with a first conductive material. In some embodiments, 1111 corresponds to the structures illustrated in the cross-section view of FIG. 8.

FIG. 12 is a plan view illustrating one embodiment of a high voltage transistor device 1200 that includes a field structure 122a with seven conduction units 123 arranged in a single column. It can be seen that source region 104/bulk region 109 includes five contacts 120 and the drain region 106 also includes five contacts 120. Gate electrode 108 includes two contacts 120, which can be seen in this plan view. The dielectric layer 110 covers a portion of the gate electrode 108 and the drain region 106 without overlying the contacts 120 in the drain region 106. The conduction units 123 overly the dielectric layer 110.

FIG. 13 is a plan view illustrating one embodiment of a high voltage transistor device 1300 that includes a field structure 122b with twenty conduction units 123 arranged in a staggered arrangement in three columns. It can be seen that source region 104/bulk region 109 include five contacts 120 and the drain region 106 also includes five contacts 120. Gate electrode 108 includes two contacts 120, which can be seen in this plan view. The dielectric layer 110 covers a portion of the gate electrode 108 and the drain region 106 and ends without overlying the contacts in the drain region 106. The conduction units 123 overly the dielectric layer 110.

The geometric similarity between the conduction units 123 and the contacts is evident in FIGS. 12 and 13. The simplifying effect that using discrete conduction units 123 having the same vertically elongated shape as the contacts 120 as opposed to different geometries is also evident.

Using discrete conduction units 123 stacked in a drift region of a high voltage transistor device as illustrated in FIGS. 12 and 13 allows for a layout of conduction units that follows CMOS baseline design rules and makes the fabrication process fully compatible with existing processes without necessitating additional masks or processing steps. The field structure 122 is flexible because multiple columns having different numbers of conduction units 123 may be used. The spacing between the discrete conduction units 123 may be controlled to meet various voltage requirements and to provide a uniform surface E-field and improved electrical efficiency. When a voltage is applied to the field structure, the induced depletion regions surrounding the discrete conduction units 123 merge to alleviate the surface E-field. The discrete conduction units 123 minimize occupation over the drift region to achieve less parasitic capacitance as compared to plate field structures.

The present disclosure relates to a high voltage transistor device having a field structure that includes at least one vertically elongated conduction unit that is formed concurrently with source and drain contacts to enable a low-cost method of fabrication. In some embodiments, the present disclosure relates to an integrated chip. The integrated chip includes a gate electrode disposed over a substrate between a source region and a drain region. A dielectric layer laterally extends from over the gate electrode to over a drift region laterally arranged between the gate electrode and the drain region. A plurality of metal contacts vertically extend from a bottom surface of a first inter-level dielectric (ILD) layer to a top surface of the first ILD layer. The plurality of metal contacts have a vertically elongated shape. A field structure is located within the first ILD layer overlying the substrate. The field structure includes a conduction unit having the vertically elongated shape and vertically extending from a top surface of the dielectric layer to the top surface of the first ILD layer.

In yet other embodiments, the present disclosure relates to method of forming a high voltage transistor device. In some embodiments, the method includes providing a substrate having a source region separated from a drain region by way of a channel region and a drift region; forming a gate structure over the substrate at a position arranged over the channel region; and forming a dielectric layer over portions of the gate structure and the drift region. A first inter-level dielectric (ILD) layer overlying the substrate is selectively formed to define contact openings and a field structure conduction unit opening. The contact openings and the field structure conduction unit opening comprise a similar vertically elongated shape. The contact openings are filled with a first conductive material and the conduction unit opening is filled with a second conductive material.

In other embodiments, the present disclosure relates to a high voltage transistor device. The device includes a semiconductor substrate including a source region having a first doping type separated from a drain region having the first doping type by a channel region having a second doping type and a drift region having the first doping type with a lower doping concentration than the source region and the drain region. A gate structure includes a gate electrode separated from the channel region and the drift region by a gate dielectric layer. A dielectric layer laterally extends from over the gate electrode to over the drift region. A plurality of metal contacts vertically extend from a bottom surface of a first inter-level dielectric (ILD) layer to a top surface of the first ILD layer. The plurality of metal contacts have a vertically elongated shape. A field structure is located within the first ILD layer. The field structure includes a conduction unit having the vertically elongated shape and vertically extending from a top surface of the dielectric layer to the top surface of the first ILD layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
   a gate electrode disposed over a substrate between a source region and a drain region;
   a dielectric layer laterally extending from over the gate electrode to over a drift region laterally arranged between the gate electrode and the drain region; and
   a field structure located within a first inter-level dielectric (ILD) layer overlying the substrate, wherein the field structure comprises a plurality of conduction units, each conduction unit having a vertically elongated shape and vertically extending from a top surface of the dielectric layer to a top surface of the first ILD layer, wherein the plurality of conduction units are arranged in a first column and a second column and wherein conduction units in the first column are staggered with respect to conduction units in the second column.

2. The integrated chip of claim 1, further comprising a plurality of metal contacts vertically extending from a bottom surface of the first ILD layer to the top surface of the first ILD layer, wherein the plurality of metal contacts have the vertically elongated shape.

3. The integrated chip of claim 2, wherein the plurality of conduction units comprise a same material as the plurality of metal contacts.

4. The integrated chip of claim 2, wherein one of the plurality of metal contacts electrically contacts a bulk region proximate the source region and another of the plurality of metal contacts electrically contacts the drain region.

5. The integrated chip of claim 2, wherein the first column and the second column are parallel to a column comprising two or more of the plurality of metal contacts over the drain region.

6. The integrated chip of claim 1, wherein the field structure is disposed above a portion of the dielectric layer that overlays the drift region.

7. The integrated chip of claim 1, further comprising:
   a shallow trench isolation (STI) region disposed within the substrate between the gate electrode and the drain region, wherein the STI region is laterally separated from the drain region by a non-zero distance.

8. The integrated chip of claim 1, wherein the dielectric layer has a curved surface disposed laterally between the gate electrode and the plurality of conduction units.

9. The integrated chip of claim 1, further comprising:
a conductive contact disposed on an upper surface of the gate electrode;
wherein the conduction units in the first column are aligned along a first imaginary line extending in a first direction; and
wherein the conductive contact is disposed on the upper surface of the gate electrode at a location that is separated by a first non-zero distance measured along the first direction from a second imaginary line extending along a sidewall of an outermost one of the conduction units in the first column, the sidewall facing away from the conduction units in the first column, the second imaginary line extending in a second direction that is perpendicular to the first direction and parallel to the upper surface of the gate electrode, and the second imaginary line arranged between the conductive contact and the outermost one of the conduction units in the first column.

10. The integrated chip of claim 1, wherein the dielectric layer has a first outermost sidewall that is directly over the drift region and that is laterally separated from the drain region by a non-zero distance.

11. The integrated chip of claim 10, wherein the dielectric layer has a second outermost sidewall that is directly over the gate electrode.

12. A high voltage transistor device, comprising:
a semiconductor substrate comprising a source region having a first doping type separated from a drain region having the first doping type by a channel region having a second doping type and a drift region having the first doping type with a lower doping concentration than the source region and the drain region;
a gate structure comprising a gate electrode separated from the channel region and the drift region by a gate dielectric layer;
a dielectric layer laterally extending from over the gate electrode to over the drift region; and
a field structure located within a first inter-level dielectric (ILD) layer, wherein the field structure comprises a plurality of conduction units, each conduction unit having a vertically elongated shape and vertically extending from a top surface of the dielectric layer to a top surface of the first ILD layer, wherein the plurality of conduction units are arranged in a first column and a second column and wherein conduction units in the first column are staggered with respect to conduction units in the second column.

13. The high voltage transistor device of claim 12, further comprising a plurality of metal contacts vertically extending from a bottom surface of the first ILD layer to the top surface of the first ILD layer, wherein the plurality of metal contacts have a second vertically elongated shape.

14. The high voltage transistor device of claim 13, wherein the plurality of conduction units comprise a same material as the plurality of metal contacts.

15. The high voltage transistor device of claim 13, wherein the first column and the second column are parallel to a column comprising two or more of the plurality of metal contacts over the drain region.

16. A field structure for a high voltage transistor having a gate electrode disposed over a substrate between a source region and a drain region, the field structure comprising:
a plurality of conduction units, each conduction unit having a vertically elongated shape and vertically extending from a top surface of a dielectric layer to a top surface of a first ILD layer overlying the substrate, wherein the plurality of conduction units are arranged in a first column and a second column and wherein conduction units in the first column are staggered with respect to conduction units in the second column;
wherein the dielectric layer laterally extends from over the gate electrode to over a drift region laterally arranged between the gate electrode and the drain region.

17. The field structure of claim 16, further comprising a plurality of metal contacts vertically extending from a bottom surface of the first ILD layer to the top surface of the first ILD layer, wherein the plurality of metal contacts have the vertically elongated shape.

18. The field structure of claim 17, wherein the plurality of conduction units comprise a same material as the plurality of metal contacts.

19. The field structure of claim 17, wherein one of the plurality of metal contacts electrically contacts a bulk region proximate the source region and another of the plurality of metal contacts electrically contacts the drain region.

20. The field structure of claim 19, wherein the first column and the second column are parallel to a column comprising two or more of the plurality of metal contacts over the drain region.

* * * * *